(12) United States Patent
Muramatsu

(10) Patent No.: US 8,354,727 B2
(45) Date of Patent: Jan. 15, 2013

(54) SEMICONDUCTOR DEVICE AND PROCESS FOR PRODUCING THE SAME

(75) Inventor: Satoru Muramatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 283 days.

(21) Appl. No.: 12/960,844

(22) Filed: Dec. 6, 2010

(65) Prior Publication Data

US 2011/0133290 A1  Jun. 9, 2011

(30) Foreign Application Priority Data

Dec. 9, 2009 (JP) ................. 2009-279082

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 21/20* (2006.01)

(52) U.S. Cl. ................ 257/380; 257/379; 257/E21.294; 257/E27.011; 438/382

(58) Field of Classification Search ................. 257/379, 257/380, E21.294, E27.011; 438/382
See application file for complete search history.

(56) References Cited

FOREIGN PATENT DOCUMENTS

| JP | 1-144648 | 6/1989 |
|----|----------|--------|
| JP | 7-273288 | 10/1995 |
| JP | 2001-077189 | 3/2001 |

*Primary Examiner* — David S Blum
(74) *Attorney, Agent, or Firm* — Young & Thompson

(57) ABSTRACT

A semiconductor device of high reliability and element-integrating performance, has a substrate (silicon substrate), a first trench made in the silicon substrate, a passive element layer buried in the first trench, and a first insulating film (silicon nitride film) arranged between the first trench and the passive element layer. The passive element layer projects upwardly relative to the substrate, and so too preferably the adjacent insulating film. An active element is formed such that its gate electrode, which is preferably fully silicided, has an upper end at a level higher than the upper surface of the passive element film.

20 Claims, 11 Drawing Sheets

SEMICONDUCTOR DEVICE AND PROCESS FOR PRODUCING THE SAME

CROSS-REFERENCE TO RELATED APPLICATIONS

The disclosure of Japanese Patent Application No. 2009-279082 filed on Dec. 9, 2009 including the specification, drawings, and abstract is incorporated herein by reference in its entirety.

BACKGROUND OF THE INVENTION

The present invention relates to a semiconductor device, and a process for producing the semiconductor device.

Japanese Patent Application Laid-Open No. Hei 1 (1989)-144648 (Patent Document 1) and Japanese Patent Application Laid-Open No. Hei 7 (1995)-273288 (Patent Document 2) disclose that resistance elements of a semiconductor device having bipolar transistors are formed in device isolation regions in order to improve the element-integration degree of the device. According to, for example, Patent Document 1, after each trench is formed in a substrate, a silicon oxide film is formed to be extended from the inside of the trench to the whole of the upper surface of the substrate. Thereafter, a polysilicon which is to be resistance element regions is formed, and the polysilicon is worked to remain in the trench, thereby forming resistance elements.

Japanese Patent Application Laid-Open No. 2001-077189 (Patent Document 3) discloses a technique of locating device isolation regions in a substrate when MOS transistors are formed. The documents states that when the device isolation regions are located in the substrate, a mask is once formed in a region other than element-isolation-forming regions, so as to form the device isolation region, and subsequently the mask is removed by wet etching.

SUMMARY OF THE INVENTION

The inventors of this invention have found out that the property of a passive element varies with element size reduction when a semiconductor device including MOS transistors and passive elements such as resistance elements and e-fuses is formed. The Patent Documents 1 and 2 disclose that when a bipolar transistor is formed, a trench is formed, a polysilicon is buried thereinto, and then the polysilicon is removed by chemical mechanical polishing (CMP) using a polish-stop layer for planarization to provide a passive resistance element.

When MOS transistors are formed according to the related techniques described in the documents, it is necessary to make transistor-forming regions of the upper surface of a semiconductor substrate naked. The following is difficult: in order to make the upper surface of the substrate naked by wet etching after the formation of the passive elements, only the oxide film on the upper surface of the semiconductor substrate is selectively removed while the side-wall insulating layer is caused to remain inside the trenches. In other words, when the wet etching is conducted, the side-wall insulating layer inside the trenches, as well as the insulating film on the substrate upper surface, is unfavorably removed. As a result, a short circuit is caused between the passive elements and the substrate.

Similarly, when the terminals of MOS transistors are made naked by a CMP process, the silicide region of a polysilicon resistance element is also polished, which increases contact resistance and deteriorates the device characteristics.

According to one aspect of the invention, a process for producing a semiconductor device comprises:
  forming a polish-stop layer over a substrate having a passive element region;
  making a first trench in the passive element region of the substrate and the polish-stop layer;
  embedding the first trench of the resistance element region with a first insulating film which differs in wet etching rate from the polish-stop layer;
  making an opening within the passive element region of the first insulating film;
  forming a passive element layer over the substrate where the opening is made within the passive element region of the first insulating film;
  removing the passive element layer up to the polish-stop layer; and
  removing the polish-stop layer.

In the production process of the invention, the first insulating film on the inner side wall(s) of the first trench preferably comprises the material different from that of the polish-stop layer over the upper surface of the substrate. By use of a difference in etching rate between the different materials, only the polish-stop layer can be selectively removed. For this reason, the substrate can be made naked inside the first trench while the first insulating film is caused to remain between the first trench and the passive element layer. It is therefore possible to restrain a short circuit between the passive element layer and the substrate, thereby arranging the passive element layer and a MOS transistor over the substrate.

According to another aspect of the invention, a semiconductor device comprises an active element, for example a transistor, and a passive element, for example a resistor or a fuse, formed on a common substrate. A shallow trench isolation (STI) film may be positioned between the active element and the passive element. If present, the STI film preferably projects upwardly relative to the surrounding substrate at both its periphery and its central regions. The passive element preferably comprising a passive element layer formed in a trench, and the active element comprises one or more electrodes positioned on an insulating layer formed on the common substrate.

Another insulating film is preferably arranged between the side wall(s) of the passive element layer and the substrate. Furthermore, the passive element layer and the insulating film positioned between the passive element layer and the trench preferably both project upwardly from the trench above the upper surface of the substrate. It is therefore possible to restrain a short circuit between the passive element layer and the substrate.

According to another preferred aspect of the semiconductor devices according to the invention, each of the electrodes of the active element that extend to the insulating film between the electrodes and the substrate, has an upper surface at a level higher than the upper surface of the passive element layer. Furthermore, it is possible to form these electrodes and the passive element layer from different materials.

DETAILED DESCRIPTION OF THE PREFERRED EMBODIMENTS

First Embodiment

Hereinafter, embodiments of the invention will be described with reference to the drawings. In all of the drawings, the same reference numbers are attached to (substantially) the same constituting elements, and description thereof is omitted as the case may be.

Figure 2A:
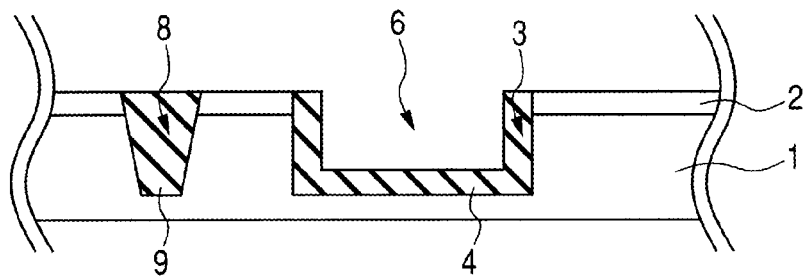
FIGS. 2A-2D are sectional views illustrating steps succeeding those of FIGS. 1A to 1D, in the process for producing a semiconductor device of the embodiment of FIGS. 1A to 1D.
Figure 2B:
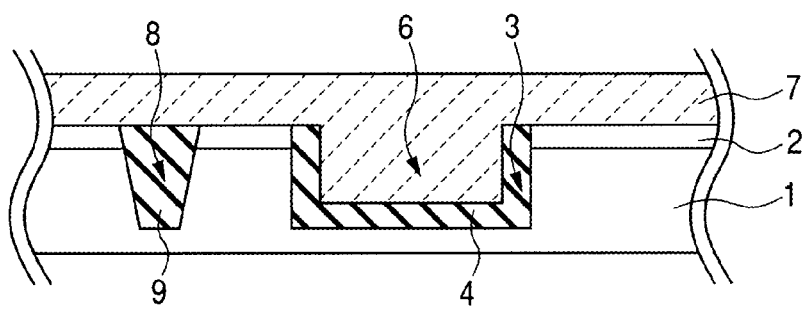
Figure 2C:
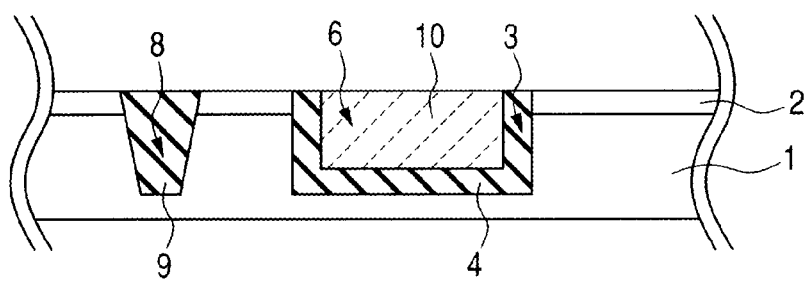
Figure 2D:
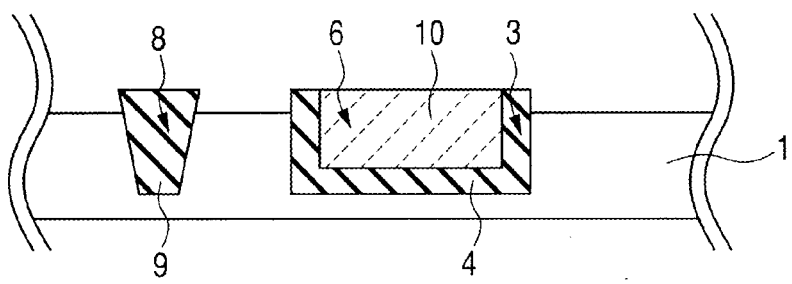

FIG. 2D illustrates a portion of a semiconductor device of a first of the embodiments.

The semiconductor device of the present embodiment has MOS transistors not illustrated.

The semiconductor device of the embodiment has a substrate (silicon substrate) 1, a first trench 3 made in the silicon substrate 1, a passive element layer 10 buried in the first trench 3, and a first insulating film (silicon nitrile film) 4 laid between the first trench 3 and the passive element layer 10. When the semiconductor device is viewed from above the device, a circumferential edge portion made by the first trench 3 is substantially consistent with a circumferential edge portion of the first insulating film (silicon nitride film) 4.

The semiconductor device of the embodiment has a second trench 8 made in the silicon substrate 1, and an element insulating film 9 buried in the second trench 8.

As illustrated in FIG. 2D, the silicon nitride film (first insulating film) 4 does not have a sticking-out region which sticks out from the first trench 3. In other words, the silicon nitride film (first insulating film) 4 is arranged inside the trench 3 but is not arranged outside the trench 3 (however, a slight deviation based on an accidental error in precision in the production process is allowable).

As illustrated in FIG. 2D, the first insulating film (silicon nitride film) 4 is laid to be projected from the first trench 3 along side walls of the passive element layer 10 projected from the first trench 3. The element insulating film 9 may have a shape projected from the second trench 8.

As illustrated in FIG. 2D, in the case of regarding the upper surface of the silicon substrate 1 as a reference surface, the upper surface of the passive element layer 10 and that of the silicon nitride film 4, which is laid on the side walls of the layer 10, are positioned to be higher than the reference surface.

The upper surface of the passive element layer 10 and that of the silicon nitride film 4 constitute substantially the same plane (however, a difference based on an accidental error in precision in the production process is allowable).

The height of the upper surface of the passive element layer 10 from the reference surface may be made equal to that of the silicon nitride film 4 therefrom. The height of the upper surface of the passive element layer 10 from the reference surface is not particularly limited, and may be appropriately set in accordance with, for example, the resistance value of the passive element layer 10.

The shape of any section of the passive element layer 10 along the direction perpendicular to the direction in which the layer 10 is laid to be extended is not particularly limited, and may be made into a rectangular, square, trapezoidal or tapered shape, or any other shape. The passive element layer 10 may be made into, for example, a columnar form.

When the silicon nitride film 4 is viewed along the direction perpendicular to the direction in which the film 4 is laid to be extended, the film 4 may be laid to be integrated therewith, or to be separated therefrom. The shape of any section of the silicon nitride film 4 along the direction perpendicular to the direction in which the film 4 is laid to be extended may be a "C"-like shape or "V"-like shape. In particular, the shape of any section of a silicon nitride film 4 portion located to be projected from the reference surface, the section being along the direction perpendicular to the direction in which the silicon nitride film 4 is laid to be extended, may be rendered, for example, a rectangular, square or trapezoidal shape, or some other shape. When the semiconductor device is viewed from above the silicon substrate 1, an end of the silicon nitride film 4, which is the projected portion of the film 4, may be formed to surround the passive element layer 10.

Furthermore, the projected portion of the silicon nitride film 4 is formed on the side walls of the passive element layer 10. In other words, the projected portion is formed inside the region where the first trench 3 is made, the region being surrounded by (imaginary) planes extended from side walls of the first trench 3 (however, on the basis of an accidental error in precision in the production process, a slight deviation from the formation in this manner is allowable).

As illustrated in FIG. 2D, the device isolation film 9 is formed inside the region where the second trench 8 is made, the region being surrounded by (imaginary) plane extended from side walls of the second trench 8. The shape of any section of the device isolation film 9 along the direction perpendicular to the direction in which the film 9 is laid to be extended is a rectangular, square, trapezoidal or tapered shape, or some other shape.

In the embodiment, the first insulating film (silicon nitride film) 4 and the device isolation film 9 may be made of the same material having substantially the same etching rate. For example, the first insulating film (silicon nitride film) 4 and the device isolation film 9 may be made of the same material. In the embodiment, silicon nitride may be used for the material.

The film thickness (height) of the device isolation film 9 from the reference surface and that of the passive element layer 10 therefrom may be made substantially the same. Moreover, the film thickness (height) of the device isolation film 9 from the reference surface and that of the silicon nitride film 4 therefrom may be made substantially the same (however, a difference based on an accidental error in precision in the production process is allowable).

The following will describe a process of the embodiment for producing a semiconductor device as the semiconductor device of the embodiment.

FIGS. 1A to 1D and FIGS. 2A to 2D are sectional views of steps of the process.

The process includes the steps of forming a polish-stop layer (silicon oxide film) 2 onto a substrate (silicon substrate) 1; removing the silicon oxide film 2 and the silicon substrate 1 partially by selective etching, thereby making a first trench 3 in the silicon substrate 1; forming a first insulating film (silicon nitride film) 4 made of a material different from that of the silicon oxide film 2 so as to be buried into the first trench 3; polishing the silicon nitride film 4 to make the silicon oxide film 2 naked; forming a concave portion 6 in the silicon nitride film 4 by selective etching; forming a second insulating film (silicon film) 7 so as to be buried into the concave portion 6; polishing the silicon film 7 to make the silicon oxide film 2 and the silicon nitride film 4 naked, thereby forming a passive element layer 10 in the first trench 3; and removing the silicon oxide film 2 by etching, thereby making the upper surface of the silicon substrate 1 and side walls of the silicon nitride film 4 naked.

In the production process of the embodiment, the step of making the first trench 3 includes the step of making a second trench 8 in the silicon substrate 1 as well as making the first trench 3 therein.

In the production process of the embodiment, through the step of forming the first insulating film (silicon nitride film) 4, the silicon nitride film 4 is formed to be buried into the second trench 8, and through the step of making the silicon oxide film 2 naked, the silicon nitride film 4 on the second trench 8 is made naked, thereby forming an device isolation film 9, and in the step of making the upper surface of the silicon substrate 1 and the side walls of the silicon nitride film 4 naked, side walls of the device isolation film 9 are made naked.

Figure 1A:
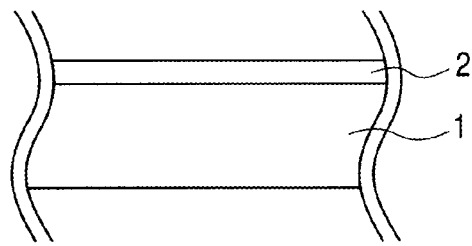
FIGS. 1A to 1D are sectional views of a process for producing a semiconductor device in a first embodiment.
Figure 1B:
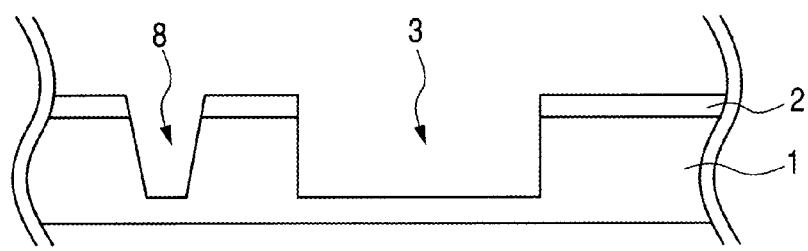

As illustrated in FIG. 1A, a silicon oxide film 2 (polish-stop layer) 2 is first formed on a silicon substrate 1 (FIG. 1A). Subsequently, a first trench 3 and a second trench 8 are made in the silicon substrate 1 (FIG. 1B). At this time, the method for making the trenches may be, for example, a method using a lithographic step and a dry etching step. Specifically, a silicon nitride film is formed on a silicon oxide film 2, and the resultant is caused to undergo a lithographic step and a dry etching step, thereby removing desired regions (a region where first-trench-3-formation is planned, and a region where second-trench-8-formation is planned) of the silicon nitride film and the silicon oxide film 2. The thus-patterned silicon oxide film 2 is used as a mask to make a first trench 3 and a second trench 8 into the silicon substrate 1 (FIG. 1B). At this time, in the mask, an opening corresponding to the region where first-trench-3-formation is planned may be made larger than an opening corresponding to the region where second-trench-8-formation is planned. In the present step, this phenomenon is positively used to make it possible to make the first trench 3 and the second trench 8 so as to make their sectional shapes different from each other. For example, the shape of a section of the first trench 3 can be made rectangular while that of a section of the second trench 8 can be made into a tapered form. In the drying etching, the tapered angles of the side walls can be varied by changing the gas composition; however, the adhesion amount has a size-dependency.

Figure 1C:
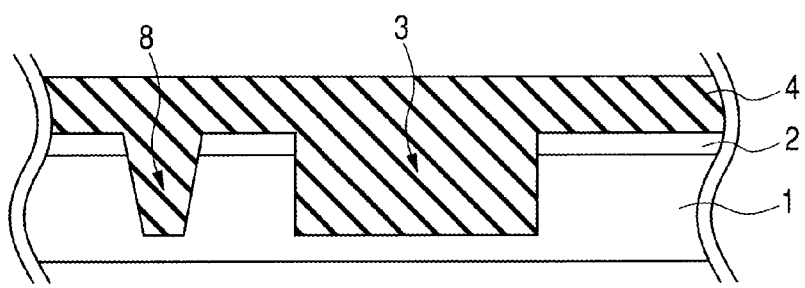

Subsequently, a silicon nitride film 4 is buried into the first trench 3 and the second trench 8. At this time, the silicon nitride film 4 can be formed on the whole of the upper surface of the silicon substrate 1 (FIG. 1C). Subsequently, the surface of the silicon nitride film 4 is made flat by a CMP (chemical mechanical polishing) method, or the like. In the CMP, the silicon oxide film (polish-stop layer) is formed on the silicon substrate 1; therefore, the height of an device isolation film 9 illustrated in FIG. 1D from the upper surface of the silicon substrate 1 (reference surface) and that of the silicon nitride film 4 therefrom can be controlled by the film thickness of the silicon oxide film 2.

Figure 1D:
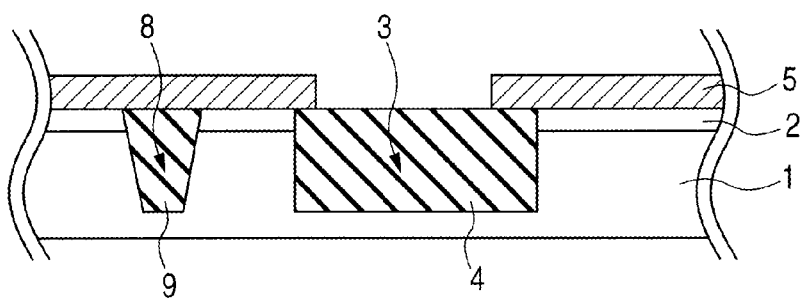

A resist pattern for a region where resistance-element-formation is planned (that is, a mask 5 having an opening corresponding to the region, where resistance-element-formation is planned) is formed (FIG. 1D). This opening is a typical example of the same openings made in the substrate 1. The opening is made inside the region of the silicon nitride film 4 when the workpiece is viewed from above the substrate.

Subsequently, a resistance-element-forming concave portion 6 is made in the silicon nitride film 4 (FIG. 2A). The method for making the concave portion 6 may be, for example, a method equivalent or similar to the method for making the trenches in the step illustrated in FIG. 1B. A silicon film (second insulating film) 7, which is to be a resistance element (resistor), is formed to be buried in the concave portion 6 (FIG. 2B). At this time, a necessary amount of a dopant may be introduced into the silicon film 7. The introduction of the dopant may be performed when the silicon film 7 is formed or after a surface-flatten step illustrated in FIG. 2C. The dopant may be, for example, boron, phosphorus, or arsenic. The Si-containing film (silicon film) 7 may be a monocrystal silicon, polycrystal silicon, amorphous silicon or silicide film, or some other film. In the present step, a film of a polycrystal silicon, which may be referred to as polysilicon, is used.

Subsequently, the upper surface of the silicon substrate 1 is flattened (FIG. 2C). At this time, CMP may be performed in the same way as in FIG. 1C. At the time of the CMP, the silicon oxide film 2 laid on the silicon substrate 1 acts as a polish-stop layer; thus, as illustrated in FIG. 2C, the respective film thicknesses of the device isolation film) 9 (silicon nitride film 4), the silicon nitride film 4, and the passive element layer 10 from the upper surface of the silicon substrate 1 (reference surface) may be made equal to each other. In this way, the film thicknesses of the regions projected from the reference surface that are regions of the device isolation film 9, the silicon nitride film 4 and the passive element layer 10 can be controlled by the film thickness of the silicon oxide film 2.

Subsequently, the silicon oxide film 2 on the silicon substrate 1 is removed (FIG. 2D). The method for removing the silicon oxide film 2 may be, for example, a wet-etching method. At this time, the difference in etching rate between the silicon oxide film 2 and the silicon nitride film 4 (or the passive element layer 10 or the second trench 8) can be used; therefore, the silicon oxide film 2 can be selectively removed. In the present step, an etching solution for removing the silicon oxide film selectively may be, for example, a solution containing $NH_4F$ (specifically, a solution containing $NH_4F$, HF and $H_2O$), or a solution containing HF (for example, a solution containing HF and $H_2O$).

Since the silicon nitride film 4 can be selectively removed as above, the upper surface of the silicon substrate and the side walls of the projected portion of the film 4 can be made naked (FIG. 2D). In the present step, the side walls of the projected portion of the device isolation film 9 can be simultaneously made naked. Thereafter, MOS transistors not illustrated can be fitted onto the silicon substrate 1.

The above-mentioned steps make it possible to yield a semiconductor device illustrated in FIG. 2D, which is the semiconductor device of the embodiment.

The following will describe effects and advantages of the embodiment.

In the semiconductor device of the embodiment, the silicon nitride film (first insulating film) 4 is laid between the side walls of the passive element layer 10 and the silicon substrate 1. In this case, the silicon nitride film (first insulating film) 4 on the inner side walls of the first trench 3 is made of the material different from that of the silicon oxide film (polish-stop layer) on the upper surface of the silicon substrate 1 according to the present production process, and the film 4 is not continuous with the film 2. Using a difference in etching rate between the different materials, only the silicon oxide film 2 can be removed. In other words, in the state that the silicon nitride film 4 on the inner side walls of the first trench 3 is caused to remain, the silicon oxide film 2 can be selectively removed. Therefore, a short circuit can be restrained between the passive element layer 10 and the silicon substrate 1. In this way, the reliability of the semiconductor device of the embodiment can be improved.

The circumferential edge portion of the silicon nitride film 4 is located to be substantially consistent with the circumferential edge portion of the first trench. Therefore, the occupation area of the circumferential edge portion of the silicon nitride film 4 in the silicon substrate 1 can be made small. In this case, only the silicon oxide film 2 can be removed in the present production process by use of a difference in etching rate between the first insulating film (silicon nitride film) 4 on the side walls of the passive element layer 10 and the silicon oxide film (polish-stop layer) on the silicon substrate 1 surface in the vicinity of the passive element layer 10. For this reason, the silicon oxide film 2 on the silicon substrate 1 surface is removed in the vicinity of the passive element layer 10, thereby making it possible to make the silicon substrate 1 naked. This matter permits one of the MOS transistors to be arranged, near the passive element layer 10, together with the layer 10. In such a manner, the element-integrating performance of the semiconductor device of the embodiment can be improved.

Furthermore, the first insulating film (silicon nitride film) 4 is laid along the side walls of the passive element layer 10 projected from the first trench 3, so as to be projected toward only a space just above the first trench 3 region. For this reason, the side walls of the projected passive element layer 10 are also protected by the silicon nitride film 4; thus, a short circuit can be restrained between the passive element layer 10 and the silicon substrate 1. In this manner, the reliability of the semiconductor device of the embodiment can be improved regardless of the shape of the passive element layer 10.

In the semiconductor device of the embodiment, the device isolation film 9 may be fitted to the silicon substrate 1, so as to be apart from the passive element layer 10. In the embodiment, the device isolation film 9 and the silicon nitride film 4 may be made of the same material (or may be made of materials having the same etching rate, respectively). As described above, therefore, by use of a difference in etching rate between the device isolation film 9 and the silicon oxide film 2, only the silicon oxide film 2 can be removed in the state that the device isolation film 9 is caused to remain. As a result, the side walls of portions of the device isolation film 9 that are projected from the second trench 8 are selectively left without being removed. Thus, the device isolation film 9 can be formed as designed. For this reason, a fluctuation in properties of the transistor can be restrained. The reliability of the semiconductor device of the embodiment can be improved.

When the upper surface of the silicon substrate 1 is regarded as a reference surface, the height of the resistor (passive element layer) 10 from the reference surface, and that of the silicon nitride film 4 laid on the side walls of the resistor 10 therefrom can each be controlled by the film thickness of the silicon oxide film 2. This is because the silicon oxide film 2 acts as a polish-stop layer. When the resistance value of the resistor (passive element layer) 10 is made, for example, high, it is advisable to make the film thickness of the silicon oxide film 2 large.

The silicon oxide film 2 acts as a polish-stop layer for CMP. This action makes it possible that the film thickness of the passive element layer 10 is hardly changed by CMP. In short, in the embodiment, the film thickness of the passive element layer 10 can be precisely controlled to a film thickness as designed. Thus, a scatter in the film thickness of the resistor (passive element layer) 10 can be restrained, so that a scatter in the resistance value can be restrained. As described herein, the embodiment makes it possible to make the formation of one or more passive elements (resistor) having desired properties compatible with the formation of one or more MOS transistors.

Moreover, the passive element layer 10, which has side walls on which the silicon nitride film 4 is formed, and the device isolation film 9 can be formed through the same step; thus, the production process can be made simple. Furthermore, the silicon oxide film 2 is selectively removed so that the device isolation film 9 and the silicon nitride film 4 can be formed as designed; thus, a production margin becomes better.

In the present step, the silicon oxide film may be etched not by the wet etching but by dry etching. In the dry etching, an over etching is usually performed in order to remove the silicon oxide film 2 surely while, in the wet etching, the silicon oxide film 2 can be selectively removed. Considering such a matter, the wet etching is more preferred from the viewpoint of a further improvement in the reliability.

The following will further describe the advantageous effects of the embodiment while the effects are compared with those of the related art.

The related techniques described in the above-mentioned patent documents are techniques in an age when the shrinkage of any element does not yet advance very much. Additionally, the techniques are applied to elements called bipolar elements, which are less affected by the shape of irregularities in their surfaces than MOS transistors. In the case of MOS transistors, transistor properties thereof are largely affected by irregularities in the surfaces of their STI (shallow trench isolation) regions, or the state of interfaces between Si and the STIs. Thus, when the STIs are formed, the amount of oxide films, on the surfaces, to be removed is carefully controlled.

When MOS transistors are formed according to such related techniques, it is necessary to make a semiconductor substrate surface where the transistors are to be formed naked. However, in the formation of the MOS transistors according to the related techniques, the following problem is caused when device isolation regions and passive element regions are formed through the same trench process:

According to the related techniques, before the formation of the transistors, an oxide film on side wall regions of the passive elements is formed to be extended from the inside of trenches to the whole of the upper surface of the substrate. Therefore, when the substrate surface is made naked by wet etching after the formation of the device isolation regions and the passive element regions, the following selective removal cannot be attained: while only the oxide film on the semiconductor substrate surface is removed, the side-wall insulating layer is caused to remain inside the trenches. As a result, even if the above-mentioned related techniques are each applied simply to MOS transistors each having a metal gate, the silicon oxide film at the boundary between any STI and Si is excessively removed so that a deterioration in properties of the MOS transistors and other problems are caused.

By contrast, in the embodiment, the silicon nitride film (first insulating film) 4 on the inner side walls of the first trench 3, and the device isolation film 9 are made of the material different from the material of the silicon oxide film (polish-stop layer) 2 on the upper surface of the silicon substrate 1. Therefore, when the device isolation regions and the passive element regions are made through the same trench process, only the silicon oxide film 2 on the upper surface of the silicon substrate 1 can be selectively removed by use of a difference in etching rate between these different materials. Thus, it is possible to prevent the problems of the related techniques, for example, the problem that boundaries between STIs and Si are excessively removed so that properties of the MOS transistors are deteriorated.

The silicon nitride film (first insulating film) 4 can be formed inside the silicon substrate 1 and between the side walls of the passive element layer 10 portion projected from the silicon substrate 1 and the silicon substrate 1. Thus, a short circuit can be restrained between the passive element layer 10 and the silicon substrate 1.

Furthermore, by the removal of the silicon oxide film 2, the silicon substrate 1 can be made naked; thus, MOS transistors can be arranged, near the passive element layer 10, together with the layer 10.

As described above, in the embodiment, the reliability of the semiconductor device is improved while the element-integrating performance thereof can be improved.

Second Embodiment

Figure 4A:
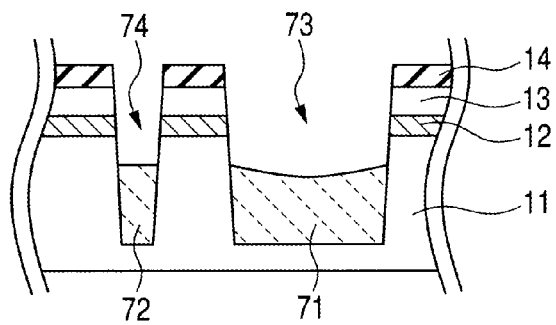
FIGS. 4A to 4D are sectional views illustrating steps succeeding those of FIGS. 3A to 3D, in the process for producing a semiconductor device of the embodiment of FIGS. 3A to 3D.
Figure 4B:
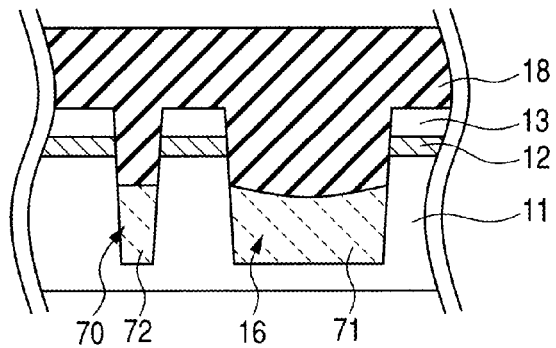
Figure 4C:
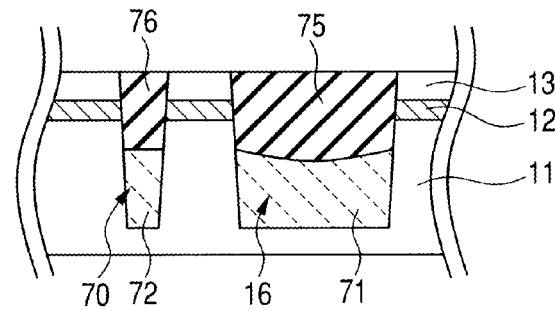
Figure 4D:
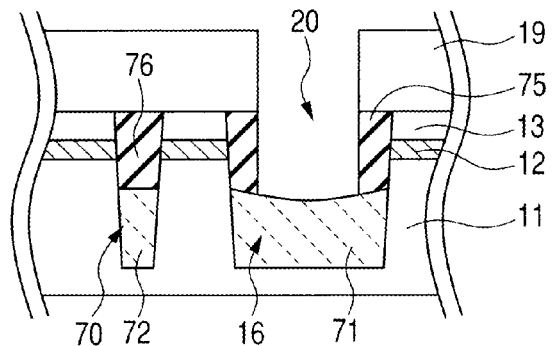

In a semiconductor device of a second embodiment, a third insulating film (silicon oxide film) 71 is laid between a substrate (silicon substrate) 1 and a first insulating film (silicon nitride film) 4 inside a second trench 8 (FIG. 4D). Except this point, the second embodiment is equivalent to the first embodiment.

The following will describe a process of the embodiment for producing a semiconductor device as the semiconductor device of the embodiment.

FIGS. 3A to 3D and 4A to 4D are sectional views of steps of the process.

Figure 6:
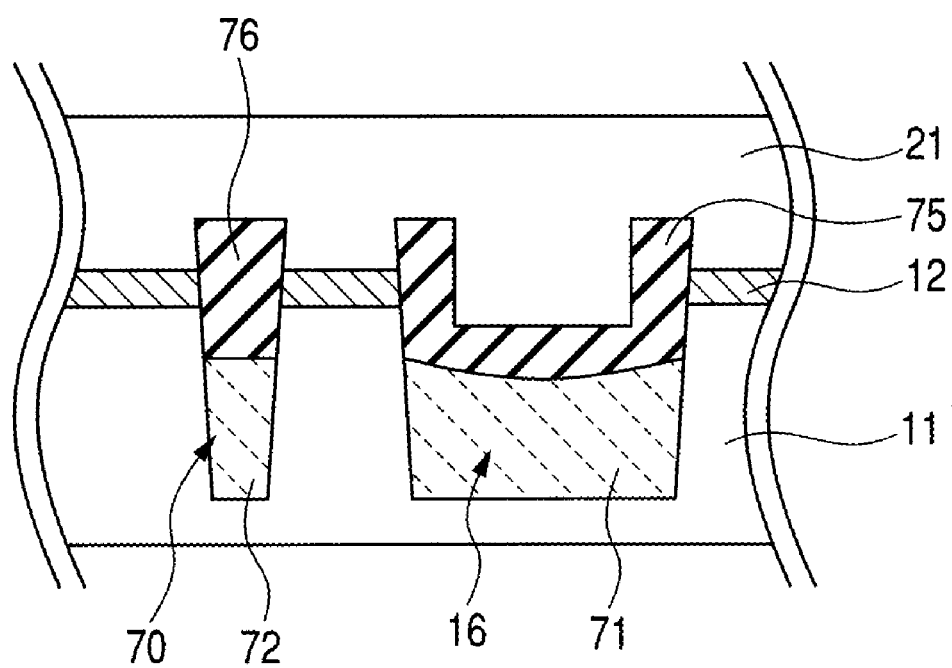
FIG. 6 is a sectional view of an example wherein the semiconductor-device-producing process in the second embodiment is partially modified.

FIG. 6 illustrates an example wherein the process is partially modified.

The process of the embodiment has the same steps as described above, and one of the steps, that is, the step of forming the first insulating film (silicon nitride film) 4 has the step of forming a third insulating film (silicon oxide film) 71 inside the first trench 3, and the step of forming the silicon nitride film 4 onto the silicon oxide film 71 to be buried into the first trench 3.

Figure 3A:
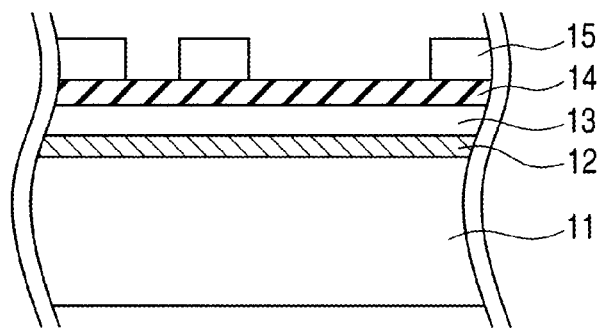
FIGS. 3A to 3D are sectional views of a process for producing a semiconductor device in a second embodiment.
Figure 3B:
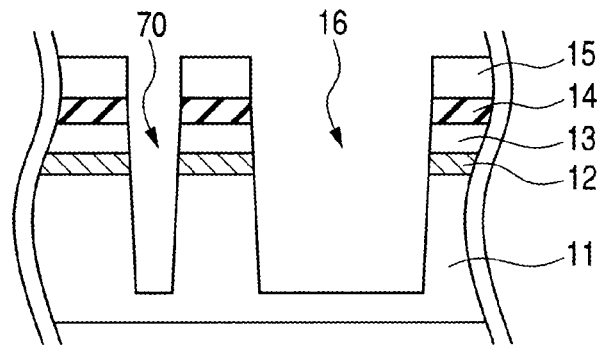

Specifically, a silicon oxide film 12, a polysilicon film and a silicon nitride film 14 are first formed, in this order, onto a silicon substrate 11. A lithographic step is then used to form a patterned resist 15 (FIG. 3A). Subsequently, a first trench 16 and a second trench 70 are made in the silicon substrate 11, so as to be apart from each other. At this time, for example, the resist 15 is used as a mask to make the first trench 16 and the second trench 70 by dry etching (FIG. 3B). It is allowable to form a film further onto the silicon nitride film 14, and use the hard mask structure to make these trenches.

Figure 3C:
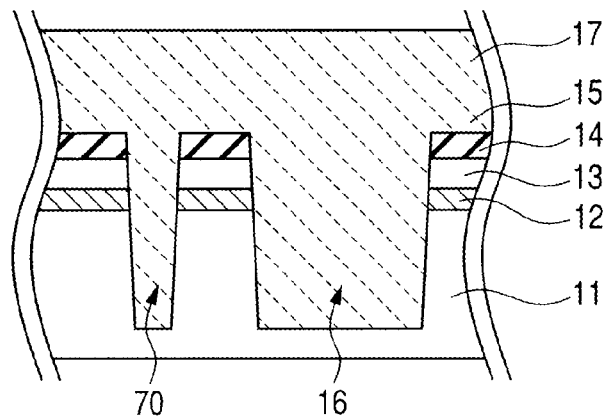
Figure 3D:
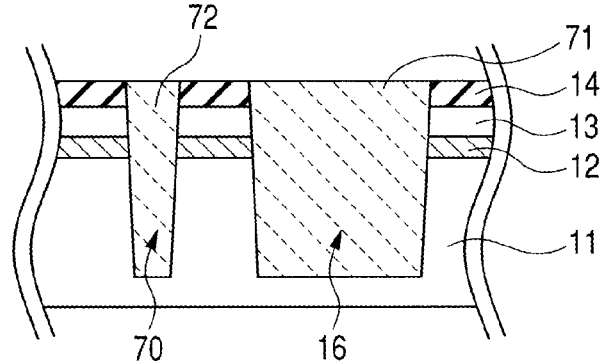

Subsequently, a silicon oxide film 17 is formed to be buried into the first trench 16 and the second trench 70 (FIG. 3C). Subsequently, CMP is used to flatten the silicon oxide film 17 (FIG. 3D). Furthermore, the buried silicon oxide film 17 is etched to position the upper surface of the silicon oxide film 71 below the upper surface (reference surface) of the silicon oxide film 71 (FIG. 4A). Thereafter, a silicon oxide film may be formed into a small thickness onto the side wall of a concave portion 73 or 74.

Figure 5A:
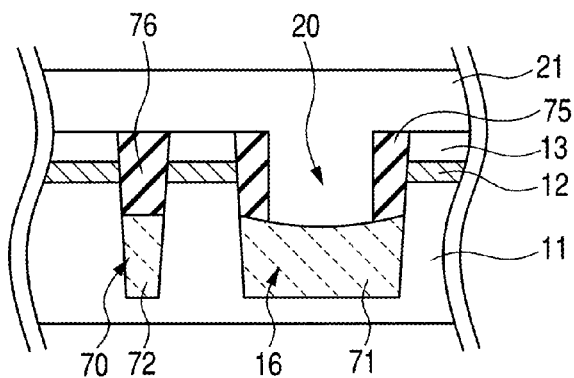
FIGS. 5A to 5D are sectional views illustrating steps succeeding those of FIGS. 4A to 4D, in the process for producing a semiconductor device of the embodiment of FIGS. 4A to 4D.
Figure 5B:
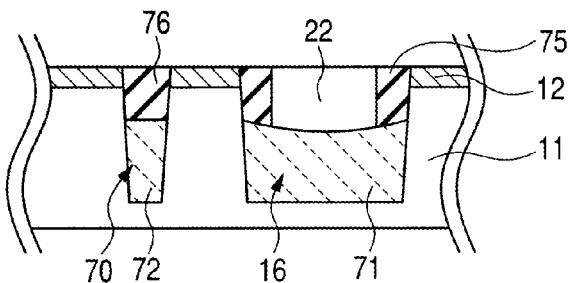

Subsequently, a silicon nitride film 18 is formed to be buried into the concave portions 73 and 74 (FIG. 4B). The polysilicon film 13 is then used as a polish-stop layer to flatten the silicon nitride film 18 by CMP (FIG. 4C). In this way, an STI having a bilayered structure (the silicon oxide film 72 and the silicon nitride film 76) is formed. Thereafter, a resist 19 is formed onto the silicon nitride film 75. A lithographic technique is used to make an opening in the resist 19 at a desired position (region where passive-element-film-22-formation is planed). The silicon nitride film 75 is then removed to make a concave portion 20 (FIG. 4D). At this time, the silicon oxide film 71, which is the lower layer of the bilayered structure STI (the silicon nitride film 75 and the silicon oxide film 71), is used as a polish-stop layer to remove the silicon nitride film 75 by a dry etching technique. Subsequently, a polysilicon film 21 is formed to be buried into the concave portion 20 (FIG. 5A).

In the step of making the concave portion 20 illustrated in FIG. 4D, the following concave portion may be made as the portion 20: a concave portion that penetrates through the first insulating film (silicon nitride film) 4 to reach the third insulating film (silicon oxide film) 71. In other words, when the controllability of the etching is high so that the concave portion 20 can be made into a constant depth at any time, it is allowable to stop the etching of the silicon nitride film 75 in the middle thereof, and subsequently bury the polysilicon film 21 thereinto (FIG. 6).

Subsequently, the silicon oxide film 12 is used as a stopper to polish the polysilicon film 21 and the polysilicon film 13 by CMP. A polysilicon resistance element (passive element film) 22 buried in the STI is then formed. At this time, in accordance with a scatter in the depth of the concave portion 20, the over-polish quantity in the CMP is adjusted to make the film thickness of the polysilicon resistance element into the same value constantly. In this way, a scatter in the resistance value can be decreased.

Figure 5C:
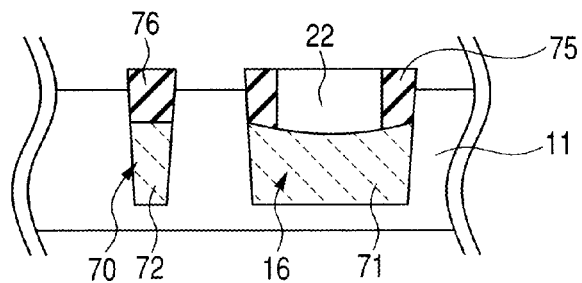
Figure 5D:
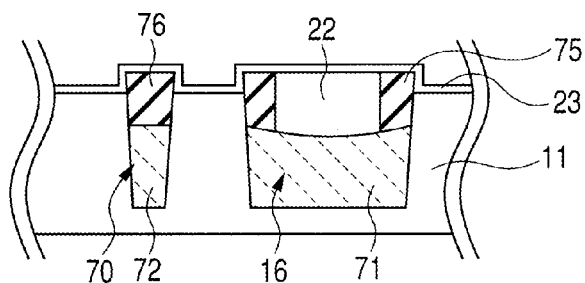

Subsequently, in the same way as in the first embodiment, the silicon oxide film 12 remaining on the upper surface of the silicon substrate 11 is selectively removed (FIG. 5C). Subsequently, a gate insulating film 23 is formed on the naked silicon substrate 11 (FIG. 5D). The gate insulating film 23 may be a high-dielectric-constant film, such as an Hf silicon oxide film, an HfSiON film or an $HfO_2$ film, as well as a silicon oxide film or a SiON film.

In the related art, a silicon oxide film (identical with a silicon oxide film on the upper surface of a silicon substrate) is buried in a trench of an STI (in the substrate). Thus, the STI is simultaneously retreated so that a divot becomes large.

By contrast, in the embodiment, the silicon nitride film 75 or the silicon nitride film 76 (different from the silicon oxide film 12 on the upper surface of the silicon substrate 11) is buried into the trench of the STI. Thus, the STI is not retreated, and a divot is not generated, either.

In the related art, the step of removing the oxide film is repeated many times; however, in each of the repeated steps, the STI is retreated and the divot also becomes large. In the related art, therefore, as a countermeasure for keeping the retreat quantity of the STI into a minimum in advance in order to restrain junction leakage current, the following countermeasure is daringly taken: a countermeasure of making the upper end surface of the oxide film buried into the STI higher than the upper end surface of the Si substrate, thereby restraining the retreat.

By contrast, in the embodiment, the STI is not retreated, and a divot is not generated, either. Since the retreat of the STI is small as described herein, the height of the upper end surface of the silicon nitride film 75 buried into the STI can be made substantially equal to that of the upper end surface of the silicon substrate 11.

The second embodiment also produces the same advantageous effects as the first embodiment.

Third Embodiment

Figure 9A:
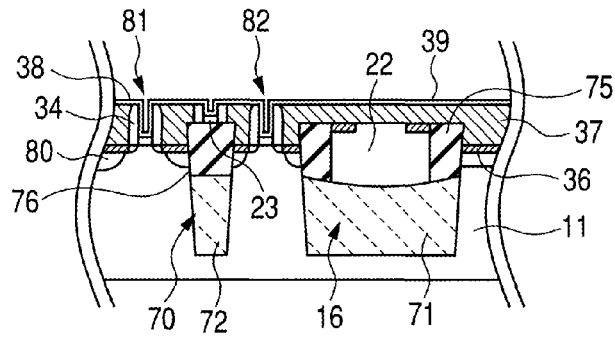
FIGS. 9A to 9D are sectional views illustrating steps succeeding those of FIGS. 8A to 8D, in the process for producing a semiconductor device of the embodiment of FIGS. 8A to 8D.
Figure 9B:
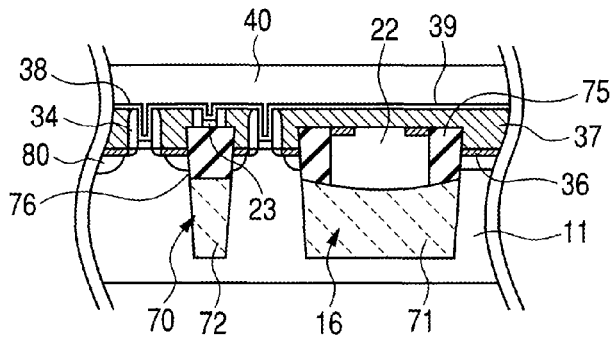
Figure 9C:
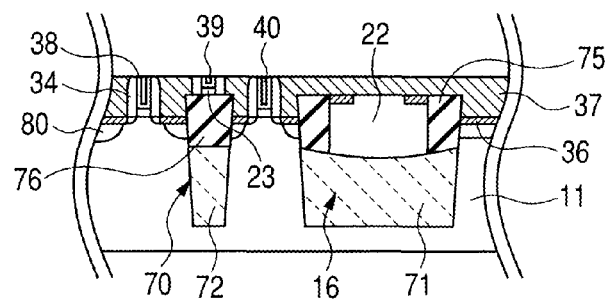
Figure 9D:
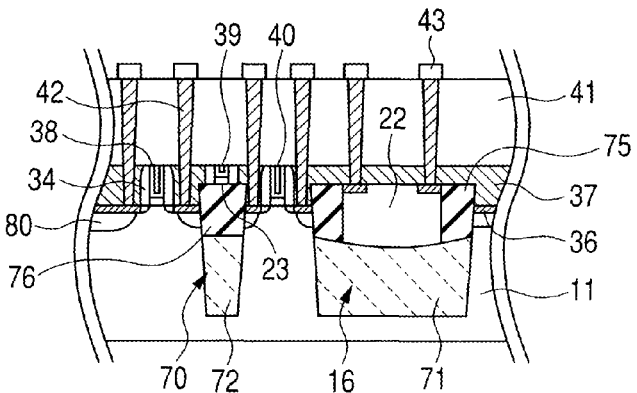

In a semiconductor device of a third embodiment, gate electrode films (a second metal film 39 and a third metal film 40) are arranged between a passive element film 22 and an STI (a silicon nitride film 76 and a silicon oxide film 72) (FIG. 9D). Except this point, the third embodiment is equivalent to the first embodiment.

The following will describe a process of the embodiment for producing a semiconductor device as the semiconductor device of the embodiment.

FIGS. 7A-7D to FIGS. 9A-9D are sectional views of steps of the process.

The process includes the same steps as in the second embodiment, and further includes the step of forming a gate electrode film over the silicon substrate 11 and between the passive element film 22 and the device isolation films (the silicon nitride film 76 and the silicon oxide film 72).

The embodiment is applied to a substitution-type metal gate process, and steps of the embodiment-applied process will be described hereinafter.

Figure 7A:
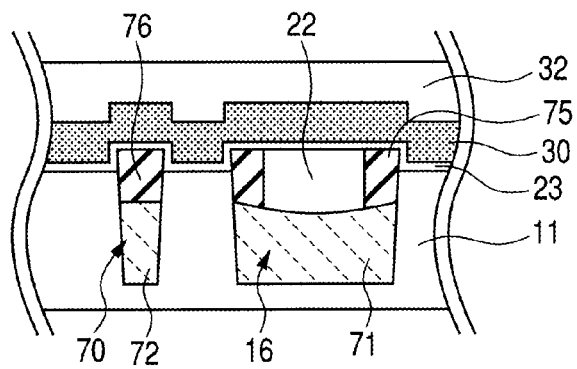
FIGS. 7A to 7D are sectional views of a process for producing a semiconductor device in a third embodiment.
Figure 7B:
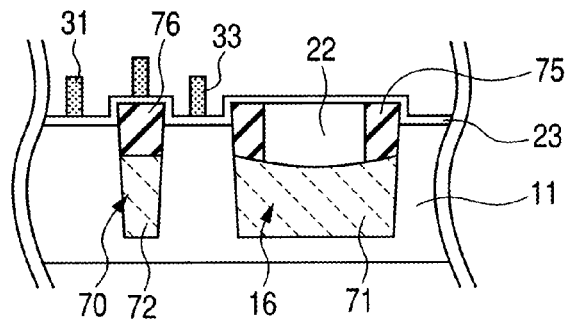
Figure 7C:
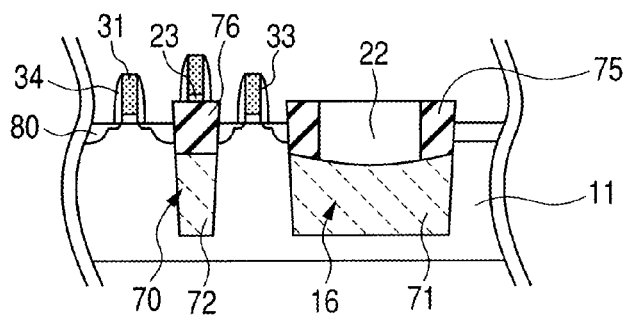
Figure 7D:
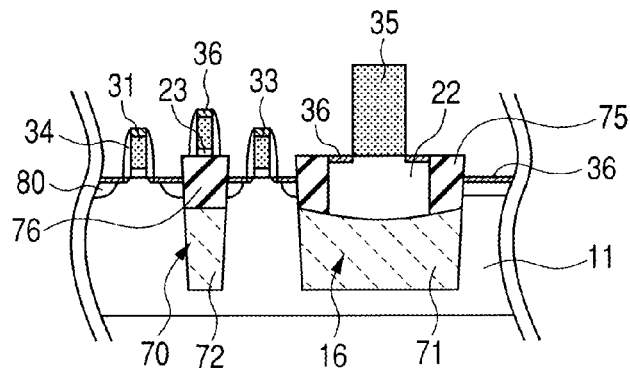

A structure illustrated in FIG. 5D is first formed in the same way as in the second embodiment. A polysilicon film 30 is formed on the gate insulating film 23, and then a resist 32 is painted thereonto (FIG. 7A). At this time, a lamination structure composed of resist films or others may be formed onto the polysilicon film 30 in order to conduct a lithographic step precisely. Subsequently, a lithographic technique is used to form a first dummy gate electrode 31 and a second dummy gate electrode 33 onto the gate insulating film 23, so as to be apart from each other (FIG. 7B). At this time, a dummy gate electrode is formed also onto the STI (the silicon nitride film and the silicon oxide film 72). Subsequently, an ion implantation technique and an annealing technique are used together to form side walls 34 on side walls of the first dummy gate electrode 31 and the second dummy gate electrode 33. A diffusion layer 80 is also formed in the vicinity of the upper surface of the silicon substrate 11. In this way, a region to which a semiconductor element is to be bonded is formed (FIG. 7C).

Next, a lithographic technique is used to cover the upper of regions where no silicide is to be formed, such as any polysilicon resistance element region, any diffusion layer resistance element region, and any e-Fuse element region, with a cover film 35 such as an oxide film. In this way, a silicide 36 is formed in regions other than the above-mentioned regions as desired regions (FIG. 7D. At such a time, according to the related art, a divot is large in the edge of an STI; thus, silicide penetrates thereinto, so that junction leakage current is unfavorably increased. By contrast, according to the embodiment, a depression of a divot is not generated so that the penetration of silicide can be restrained. As a result, junction leakage current is not increased.

Figure 8A:
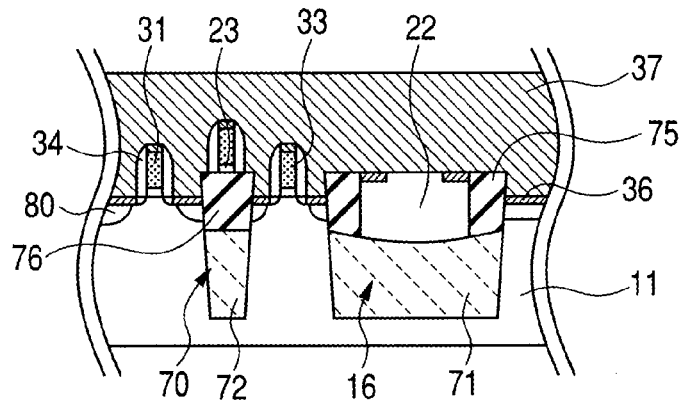
FIGS. 8A to 8D are sectional views illustrating steps succeeding those of FIGS. 7A to 7D, in the process for producing a semiconductor device of the embodiment of FIGS. 7A to 7D.
Figure 8B:
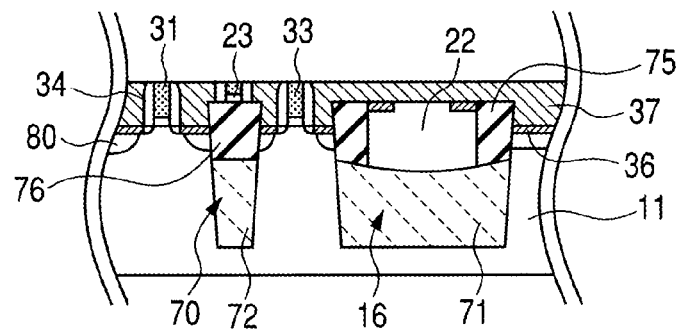

Subsequently, a first interlayer dielectric 37, such as a silicon oxide film, is formed on the workpiece (FIG. 8A). CMP is then used to polish the workpiece until the upper end surfaces of the first dummy gate electrode 31 and the second dummy gate electrode 33 are made naked (FIG. 8B). At such a time, according to the related art, the silicide-formed region as a contact-coupled region of a polysilicon resistance element is also polished, so that the contact resistance is increased. As a result, the semiconductor device in the related art is deteriorated in characteristics thereof. In order to avoid this problem in the related art, for example, the following countermeasure is required: CMP is very precisely controlled, which is not practical; or the upper surface of the STI is raised, in which junction leakage current is increased. However, the countermeasure has a demerit. By contrast, according to the embodiment, the polysilicon resistance layer is buried into the STI region; thus, the present step can easily be realized without producing any bad effect.

Figure 8C:
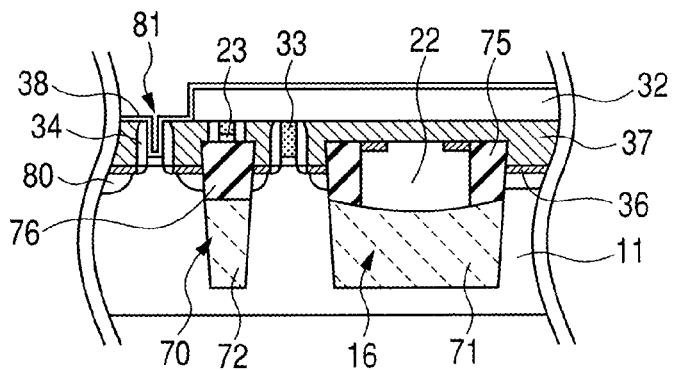
Figure 8D:
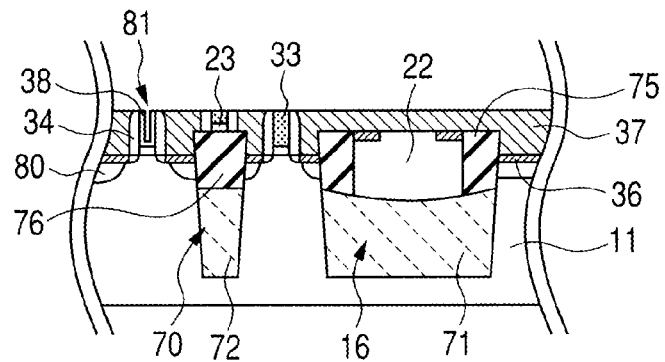

Subsequently, a resist 32 is formed and patterned to make an opening in the upper of the first dummy gate electrode 31. In order to form a first metal gate, the polysilicon of the first dummy gate electrode 31 is then removed in a region where PMOS-formation is planned. In this way, a third concave portion 81 is made. A first metal film 38 is then formed inside the third concave portion 81 (FIG. 8C). Subsequently, CMP is used to remove an unnecessary portion of the first metal film 38 (FIG. 8D). At such a time, according to the related art, the polysilicon resistance layer may be further polished.

Subsequently, in order to form a second metal gate, the polysilicon of the second dummy gate electrode 33 is removed in the region where NMOS-formation is planned. In this way, a fourth concave portion 82 is made. A second metal film 39 is formed inside the fourth concave portion 82. A third metal film 40 is formed onto the workpiece in order to bury the film completely into the gate electrode (the third concave portion 81 and the fourth concave portion 82) (FIG. 9B. Subsequently, CMP is used to polish the workpiece in order to remove excesses of the second metal film 39 and the third metal film 40 (FIG. 9C). At such a time, according to the related art, the polysilicon resistance layer is again and again polished so that a performance that the film thickness can be controlled is deteriorated. As a result, a scatter in the resistance value is generated.

Thereafter, usual contact-forming- and wiring-forming-techniques are used to form a second interlayer dielectric 41, contact plugs 42, and a wiring layer 43.

Through the above-mentioned steps, a semiconductor device is yielded as the semiconductor device of the embodiment (FIG. (9D).

As described above, when the metal gate is further formed, the passive element region is beforehand formed in the STI region with a good film-thickness precision by use of the stopper. Therefore, such floating gates can be formed with a good consistency.

The third embodiment also produces the same advantageous effects as the first and second embodiments.

In the embodiment, the first dummy gate electrode 31 and the second dummy gate electrode 33 may be arranged in the region where NMOS-formation is planned, and the region where PMOS-formation is planned, respectively.

Fourth Embodiment

Figure 11A:
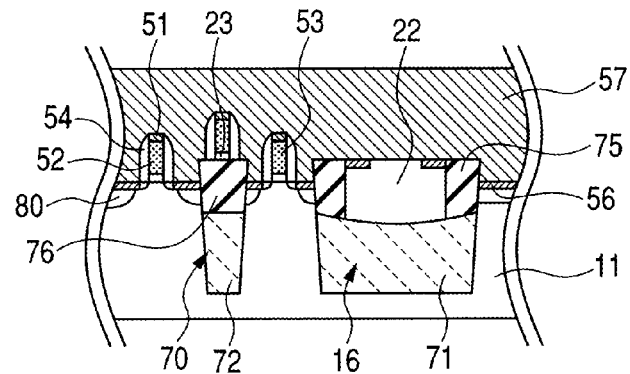
FIGS. 11A to 11D are sectional views illustrating steps succeeding those of FIGS. 10A to 10D, in the process for producing a semiconductor device of the embodiment of FIGS. 10A to 10D.
Figure 11B:
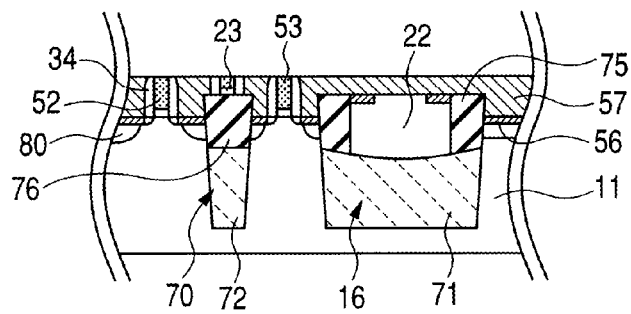
Figure 11C:
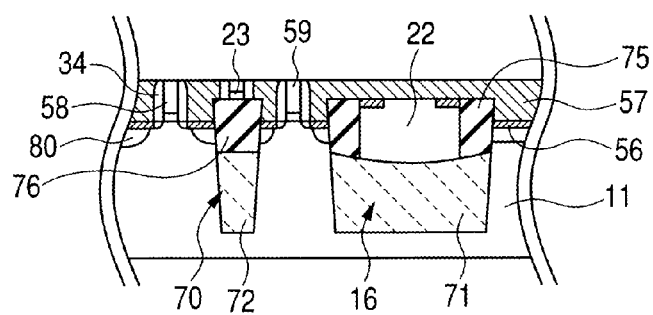
Figure 11D:
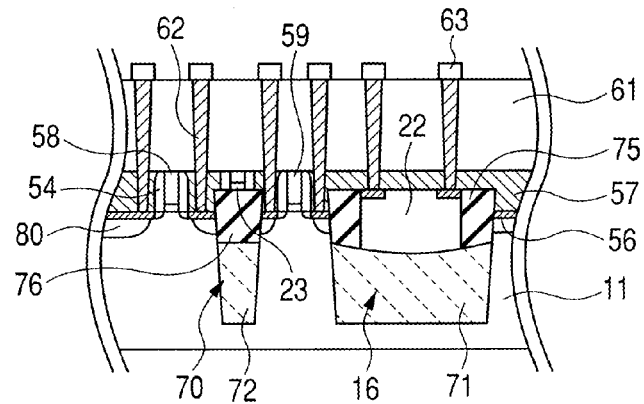

In a semiconductor device of a fourth embodiment, gate electrode films (a second metal film 39 and a third metal film 40) are arranged between a passive element film 22 and an STI (a silicon nitride film 76 and a silicon oxide film 72) (FIG. 11D). Except this point, the fourth embodiment is equivalent to the first embodiment.

The following will describe a process of the embodiment for producing a semiconductor device as the semiconductor device of the embodiment.

FIGS. 10A-10D and FIGS. 11A-11D are sectional view of steps of the process.

The process includes the same steps as in the third embodiment, and further includes the step of forming a gate electrode film (second polysilicon gate electrode) 53 over the silicon substrate 11 and between the passive element film 22 and the device isolation films (the silicon nitride film 76 and the silicon oxide film 72).

The embodiment is applied to a FUSI (full silicide) gate process, and steps of the embodiment-applied process will be described hereinafter.

Figure 10A:
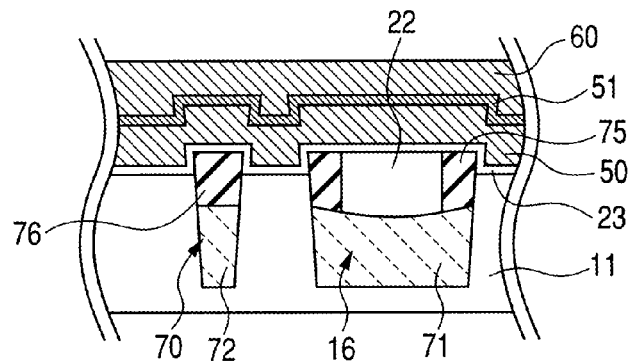
FIGS. 10A to 10D are sectional views of a process for producing a semiconductor device in a fourth embodiment.
Figure 10B:
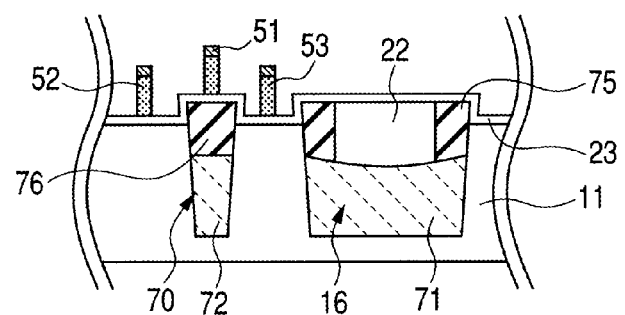
Figure 10C:
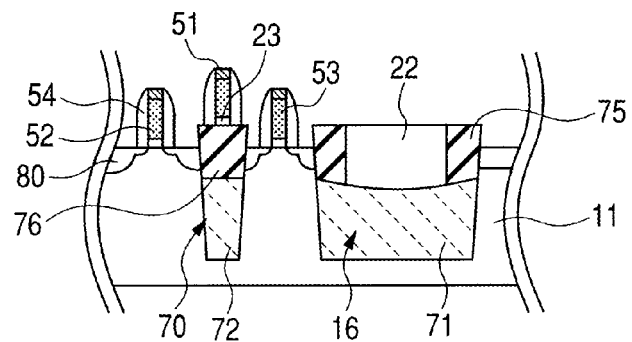
Figure 10D:
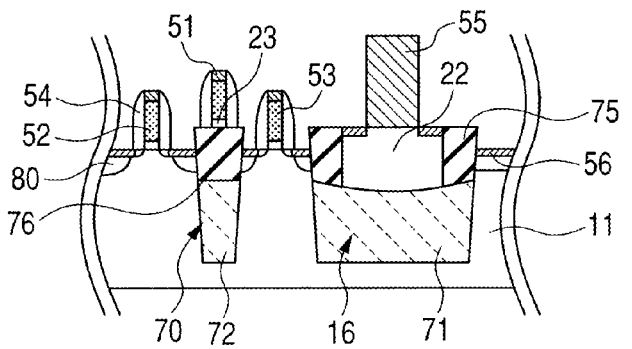

A structure illustrated in FIG. 5D is first formed in the same way as in the second embodiment. A polysilicon film 50 and a silicon nitride film (insulating film) 51 are formed, in this order, onto the gate insulating film 23. A resist 60 is painted onto the silicon nitride film 51 (FIG. 10A). At this time, a lamination structure composed of resist films or others may be formed onto the silicon nitride film 51 in order to conduct a lithographic step precisely. Subsequently, a lithographic technique is used to form a first polysilicon gate electrode 52 and a second polysilicon gate electrode 53, so as to be apart from each other (FIG. 10B). At this time, a second polysilicon gate electrode 53 is formed over the silicon substrate 1 and between the passive element film 22 and the device isolation films (the silicon nitride film 76 and the silicon oxide film 72). Next, an ion implantation technique and an annealing technique are used together to form side walls 54 onto side walls of the first polysilicon gate electrode 52 and the second polysilicon gate electrode 53. A diffusion layer 80 is also formed in the vicinity of the upper surface of the silicon substrate 11. In this way, a region to which a semiconductor element is to be bonded is formed (FIG. 10C).

Next, a lithographic technique is used to cover the upper of regions where no silicide is to be formed, such as any polysilicon resistance element region, any diffusion layer resistance element region, and any e-Fuse element region, with a cover film 55 such as an oxide film. In this way, a silicide 56 is formed in regions other than the above-mentioned regions as desired regions (FIG. 10D. At such a time, according to the related art, a divot is large in the edge of an STI; thus, silicide penetrates thereinto, so that junction leakage current is increased. By contrast, according to the embodiment, a depression of a divot is not generated so that the penetration of silicide can be restrained. As a result, junction leakage current is not increased.

Subsequently, a first interlayer dielectric 57, such as a silicon oxide film, is formed on the workpiece (FIG. 11A). CMP is then used to polish the workpiece until the upper end surfaces of the first polysilicon gate electrode 52 and the second polysilicon gate electrode 53, or the upper end surface of the silicon nitride film 51 on these electrodes are made naked (FIG. 11B). At such a time, according to the related art, the silicide-formed region as a contact-coupled region of a polysilicon resistance element is also polished, so that the contact resistance is increased. The semiconductor device in the related art is deteriorated in characteristics thereof. In order to avoid this problem in the related art, for example, the following countermeasure is required: the CMP is very precisely controlled, which is not practical; or the upper surface of the STI is raised, in which junction leakage current is increased. However, the countermeasure has a demerit. By contrast, according to the embodiment, the polysilicon resistance layer is buried into the STI region; thus, the present step can easily be realized without producing any bad effect.

Subsequently, in order to form a FUSI gate, a composition controlling technique, an impurity controlling technique or the like is used. The polysilicon of the first polysilicon gate electrode 52 in the PMOS region and the polysilicon of the second polysilicon gate electrode 53 in the NMOS region are then made into full silicide. A first FUSI gate electrode 58 and a second FUSI gate electrode 59 are formed for different conductive-type transistors (FIG. 11C). At such a time, according to the related art, in order not to make a polysilicon resistance layer into full silicide, it is necessary to cover and conceal the layer in advance. Thus, the polysilicon resistance layer may be unsilicided or may comprise silicided regions together with unsilicided regions.

Thereafter, usual contact-forming- and wiring-forming-techniques are used to form a second interlayer dielectric 61, contact plugs 62, a wiring layer 63 and others.

In this way, a semiconductor device is yielded as the semiconductor device of the embodiment (FIG. 11D).

As described above, in the case of forming the FUSI gates further, the stopper is used to form the passive element region beforehand in the STI region with a film thickness precision. Therefore, such floating gates can be formed with a good consistency.

In the embodiment, the second FUSI gate electrode 59 is formed over the silicon substrate 11 and between the passive element film 22 and the device isolation films (the silicon nitride film 76 and the silicon oxide film 72). Thus, the element-integrating performance of the semiconductor device can be further improved.

The fourth embodiment also produces the same advantageous effects as the first and second embodiments.

In the embodiment, the first FUSI gate electrode 58 and the second FUSI gate electrode 59 may be arranged in the NMOS region and the PMOS region, respectively.

The above has described embodiments of the inventions; however, these embodiments are mere examples of the invention. Thus, in the invention, various structures other than the aforementioned structures may be adopted.

For example, in each of the semiconductor devices of the first to fourth embodiments, a fuse may be set instead of the resistance element (resistor). In a method for forming the fuse (passive element layer) at this time, use may be made of a method of forming a film containing one or more selected from the group of Ti, TiN, Ta, TaN, W, Mo, Cr, Ni, Al and Cu instead of the method of forming the film containing Si.

What is claimed is:

1. A process for producing a semiconductor device, comprising the steps of:
   forming a polish-stop layer over a substrate having a passive element region;
   making a first trench in the passive element region of the substrate and the polish-stop layer;
   embedding the first trench of the resistance element region with a first insulating film which differs in wet etching rate from the polish-stop layer;
   making an opening within the passive element region of the first insulating film;
   forming a passive element layer over the substrate where the opening is made within the passive element region of the first insulating film;
   removing the passive element layer up to the polish-stop layer; and
   removing the polish-stop layer.

2. The process for producing a semiconductor device according to claim 1,
wherein the substrate further includes a device isolation region, and
wherein in the step of making the first trench, the process further comprises the step of:
making a second trench in the device isolation region.

3. The process for producing a semiconductor device according to claim 2,
wherein the second trench is embedded with the first insulating film and the first insulating film becomes a device isolation film.

4. The process for producing a semiconductor device according to claim 1, wherein the step of forming the first insulating film includes the steps of:
forming a third insulating film inside the first trench; and
forming the first insulating film over the third insulating film to be buried into the first trench.

5. The process for producing a semiconductor device according to claim 4, wherein in the step of making the opening, the following is made as the opening: a opening that penetrates through the first insulating film to reach the third insulating film.

6. The process for producing a semiconductor device according to claim 1, wherein the polish-stop layer is a silicon oxide film.

7. The process for producing a semiconductor device according to claim 1, wherein the first insulating film is a silicon nitride film.

8. The process for producing a semiconductor device according to claim 1, wherein the passive element layer is a film including Si.

9. The process for producing a semiconductor device according to claim 4, wherein the third insulating film is a silicon oxide film.

10. The process for producing a semiconductor device according to claim 3, further comprising the step of:
forming a gate electrode film over the substrate and between the passive element layer and the device isolation film.

11. A semiconductor device, comprising at least one active element and at least one passive element formed on a common substrate, wherein the at least one active element comprises a gate electrode extending to said common substrate and separated therefrom by a gate insulating film, and wherein said at least one passive element comprises a passive element film formed in a trench in said common substrate, wherein said passive element film has an uppermost planar surface disposed at a lower level than an uppermost end of said gate electrode.

12. The semiconductor device according to claim 11, further comprising a shallow trench isolation (STI) film formed in said common substrate at a position between said at least one active element and said at least one passive element, and wherein said STI film and said passive element film each project upwardly from adjacent surfaces of said common substrate.

13. The semiconductor device according to claim 11, wherein said gate electrode is a fully silicided material and said passive element film is a polysilicon that is unsilicided or less than fully silicided.

14. The semiconductor device according to claim 11, wherein said at least one active element is a transistor.

15. The semiconductor device according to claim 11, wherein said at least one passive element is a resistor.

16. The semiconductor device according to claim 11, wherein said at least one passive element is a fuse.

17. The semiconductor device according to claim 11, wherein said at least one passive element further comprises an insulating film lining said trench and positioned between said trench and said passive element film.

18. The semiconductor device according to claim 17, wherein said insulating film lining said trench and said passive element film both project upwardly relative to a surrounding surface of said common substrate.

19. A semiconductor device, comprising at least one active element and at least one passive element formed on a common substrate, wherein the at least one active element comprises a gate electrode extending to said common substrate and separated therefrom by a gate insulating film, and wherein said at least one passive element comprises a passive element film formed in a trench in said common substrate, wherein said passive element film has an uppermost planar surface disposed at a higher level than a surrounding surface of said common substrate.

20. The semiconductor device according to claim 19, wherein said at least one passive element further comprises an insulating film lining said trench and positioned between said trench and said passive element film, wherein said insulating film lining said trench and said passive element film both project upwardly relative to a surrounding surface of said common substrate.

* * * * *